(12) United States Patent
Daginnus-Metzen et al.

(10) Patent No.: US 11,217,467 B2
(45) Date of Patent: Jan. 4, 2022

(54) TRANSPORT SYSTEM

(71) Applicant: Infineon Technologies AG, Neubiberg (DE)

(72) Inventors: Michael Daginnus-Metzen, Lippstadt (DE); Evelin Palko, Nagykáta (HU); Benedikt Reuber, Geseke (DE); Charles Rimbert-Riviere, Soest (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/062,655

(22) Filed: Oct. 5, 2020

(65) Prior Publication Data

US 2021/0111049 A1    Apr. 15, 2021

(30) Foreign Application Priority Data

Oct. 9, 2019 (EP) .................. 19202221

(51) Int. Cl.
*B65D 81/20* (2006.01)
*B65D 85/30* (2006.01)
(Continued)

(52) U.S. Cl.
CPC ........ *H01L 21/67386* (2013.01); *B65B 23/20* (2013.01); *B65D 77/0406* (2013.01);
(Continued)

(58) Field of Classification Search
CPC ............ B65D 77/0406; B65D 81/2015; B65D 81/20; B65D 81/2007; B65D 85/30;
(Continued)

(56) References Cited

U.S. PATENT DOCUMENTS

| 4,886,162 | A | * | 12/1989 | Ambrogio | .......... B65D 81/2015 |
| | | | | | 206/710 |
| 5,211,717 | A | * | 5/1993 | Skoura | .............. H01L 21/67383 |
| | | | | | 206/303 |

(Continued)

FOREIGN PATENT DOCUMENTS

| FR | 2819794 A1 | 7/2002 |
| JP | 2000315722 A | 11/2000 |
| JP | 2013145768 A | 7/2013 |

*Primary Examiner* — Luan K Bui
(74) *Attorney, Agent, or Firm* — Murphy, Bilak & Homiller, PLLC

(57) ABSTRACT

A transportation system for semiconductor substrates includes a tray, lid and packaging bag. The tray includes a bottom and circumferential sidewalls. The tray has an opening on a top side and is configured to receive semiconductor substrates through the opening, the substrates being stacked onto each other in the tray in parallel to the tray bottom. The lid includes a cover plate and at least two arms extending from the plate. The arms are configured to be inserted into the tray between the tray sidewalls and the semiconductor substrates. The cover plate is configured to cover the tray opening when the lid is fully mounted to the tray. The packaging bag is configured to enclose the tray with the substrates stacked therein and lid arranged thereon, and to be evacuated of air and sealed such that the tray and lid arranged in the bag are vacuum sealed inside the bag.

14 Claims, 3 Drawing Sheets

(51) Int. Cl.
*B65B 31/04* (2006.01)
*H01L 21/673* (2006.01)
*B65B 23/20* (2006.01)
*B65D 77/04* (2006.01)

(52) U.S. Cl.
CPC ......... *B65D 81/2015* (2013.01); *B65D 85/30* (2013.01); *H01L 21/67376* (2013.01); *H01L 21/67389* (2013.01)

(58) Field of Classification Search
CPC ......... H01L 21/67386; H01L 21/67376; H01L 21/67389; B65B 23/20; B65B 31/04; B65B 51/146
USPC ............ 206/454, 524.8, 710, 712, 720, 832; 53/405, 408
See application file for complete search history.

(56) References Cited

U.S. PATENT DOCUMENTS

| | | | | |
|---|---|---|---|---|
| 8,556,079 | B2* | 10/2013 | Pylant | H01L 21/67369 206/710 |
| 8,863,956 | B2* | 10/2014 | Brooks | H01L 21/67369 206/710 |
| 2002/0014435 | A1* | 2/2002 | Bores | H01L 21/67369 206/710 |
| 2004/0045263 | A1 | 3/2004 | Haggard et al. | |
| 2004/0134829 | A1* | 7/2004 | Shih | H01L 21/67386 206/710 |
| 2006/0237343 | A1* | 10/2006 | Fuyumuro | H01L 21/67132 206/710 |
| 2009/0260329 | A1* | 10/2009 | Ochoa | H01L 21/67386 53/473 |
| 2012/0181215 | A1 | 7/2012 | Brooks et al. | |
| 2017/0372931 | A1 | 12/2017 | Kirkland | |

* cited by examiner

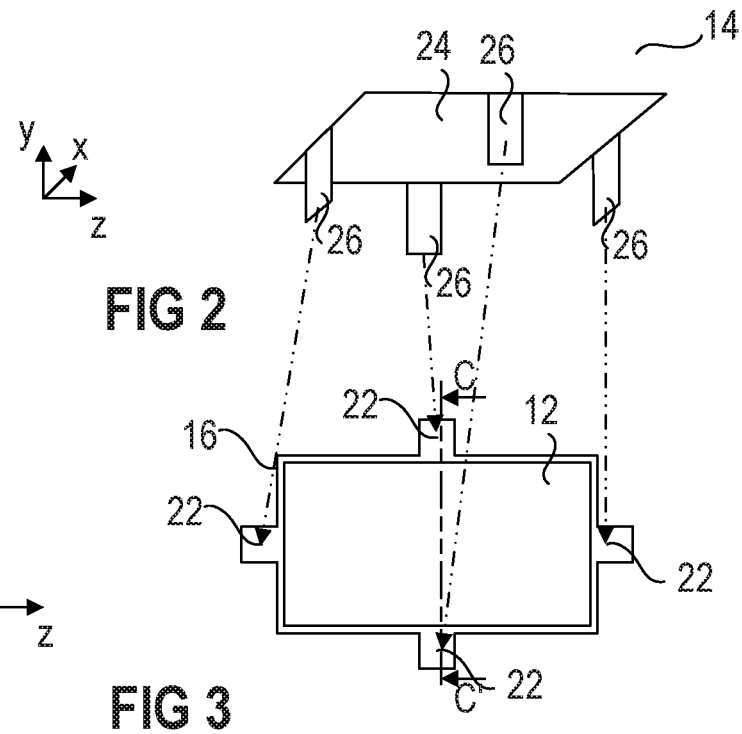
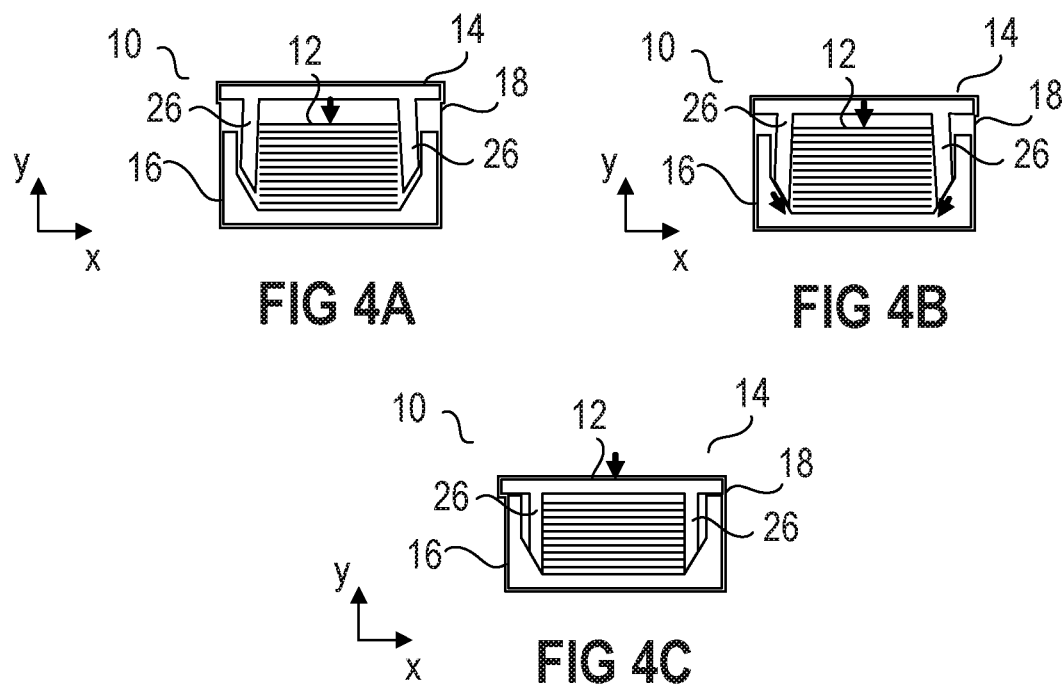

TRANSPORT SYSTEM

TECHNICAL FIELD

The instant disclosure relates to a transport system, in particular to a transport system for semiconductor substrates.

BACKGROUND

Power semiconductor module arrangements often include at least one semiconductor substrate arranged in a housing. A semiconductor arrangement including a plurality of controllable semiconductor elements (e.g., two IGBTs in a half-bridge configuration) is arranged on each of the at least one substrate. The at least one substrate may be arranged on a base plate. The base plate may form a bottom of the housing.

During production and assembly of power semiconductor module arrangements, especially before mounting a semiconductor arrangement on a semiconductor substrate and before mounting at least one semiconductor substrate on the base plates, usually a great number of semiconductor substrates need to be handled. A plurality of semiconductor substrates may be produced and the finished bare semiconductor substrates may then be packaged for shipping or for transporting them to a power semiconductor module assembly line, for example. Even bare semiconductor substrates that are not yet finished, e.g., semiconductor substrates that require one or more additional production steps such as forming or structuring one or more metallization layers on a dielectric insulation layer, for example, may be packaged for shipping or for transporting them to another production line. Even further, fitted semiconductor substrates with one or more elements such as, e.g., semiconductor bodies mounted thereon, may be packaged for shipping or for transporting them to a further production or placement line.

There is a need for a transportation system for finished or unfinished, bare or fitted semiconductor substrates that allows to safely transport a plurality of semiconductor substrates in a space-saving way and without damage.

SUMMARY

A transportation system for semiconductor substrates includes a tray including a bottom and circumferential sidewalls, wherein the tray has an opening on its top side and is configured to receive a plurality of semiconductor substrates through the opening, wherein the plurality of semiconductor substrates are stacked onto each other in the tray in parallel to the bottom of the tray. The transportation system further includes a lid including a cover plate and at least two arms extending from the cover plate, wherein the at least two arms are configured to be inserted into the tray between the sidewalls of the tray and the plurality of semiconductor substrates, and the cover plate is configured to cover the opening of the tray when the lid is fully mounted on the tray. The transportation system further includes a packaging bag configured to enclose the tray with the plurality of semiconductor substrates stacked therein and the lid arranged thereon. The packaging bag is configured to be evacuated and sealed such that the tray and the lid arranged in the packaging bag are vacuum sealed inside the packaging bag, and, when a vacuum is generated inside the packaging bag, the lid is pressed onto the tray and the arms of the lid move towards the plurality of semiconductor substrates, thereby exerting pressure on the plurality of semiconductor substrates from at least two sides and holding the plurality of semiconductor substrates in place.

A method includes stacking a plurality of semiconductor substrates inside a tray, the tray including a bottom and circumferential sidewalls, wherein the tray has an opening on its top side and is configured to receive the plurality of semiconductor substrates through the opening, wherein the plurality of semiconductor substrates are stacked onto each other in the tray in parallel to the bottom of the tray. The method further includes arranging a lid on the tray, wherein the lid includes a cover plate and at least two arms extending from the cover plate, wherein the at least two arms are inserted into the tray between the sidewalls of the tray and the plurality of semiconductor substrates, and the cover plate covers the opening of the tray when the lid is fully mounted to the tray. The method further includes arranging the tray with the lid arranged thereon in a packaging bag such that the packaging bag encloses the tray with the plurality of semiconductor substrates stacked therein and the lid arranged thereon, and evacuating and sealing the packaging bag such that the tray and the lid arranged in the packaging bag are vacuum sealed inside the packaging bag. When a vacuum is generated inside the packaging bag, the lid is pressed onto the tray and the arms of the lid move towards the plurality of semiconductor substrates, thereby exerting pressure on the plurality of semiconductor substrates from at least two sides and holding the plurality of semiconductor substrates in place.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

BRIEF DESCRIPTION OF THE DRAWINGS

FIG. 2 schematically illustrates a three-dimensional view of an exemplary cover of a transportation system.

FIG. 3 schematically illustrates a top view of an exemplary tray of a transportation system.

FIGS. 4A to 4C schematically illustrate cross-sectional views of an exemplary transportation system during mounting.

DETAILED DESCRIPTION

Figure 1A:
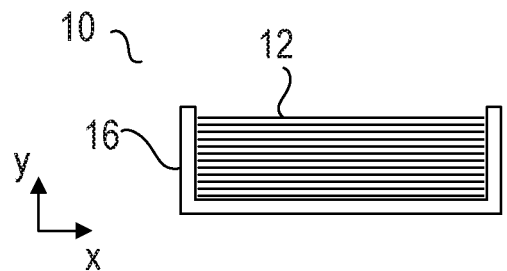
FIGS. 1A to 1E schematically illustrate a method for packaging a plurality of semiconductor substrates.

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not necessarily require the existence of a "first element" and a "second element". A semiconductor body as described herein may be made from (doped) semiconductor material and may be a semiconductor chip or be included in a semiconductor chip. A semiconductor body has electrically connecting pads and includes at least one semiconductor element with electrodes.

Power semiconductor module arrangements often include a housing and a semiconductor substrate that is mounted on a base plate and inside the housing. The base plate may be arranged inside the housing or may form a bottom of the housing, for example. The at least one semiconductor substrate that is mounted on the base plate may include a dielectric insulation layer, a (structured) first metallization layer attached to the dielectric insulation layer, and a (structured) second metallization layer attached to the dielectric insulation layer. The dielectric insulation layer is disposed between the first and second metallization layers.

Each of the first and second metallization layers of the semiconductor substrate may consist of or include one of the following materials: copper; a copper alloy; aluminum; an aluminum alloy; any other metal or alloy that remains solid during the operation of the power semiconductor module arrangement. The semiconductor substrate may be a ceramic substrate, that is, a substrate in which the dielectric insulation layer is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer may consist of or include one of the following materials: $Al_2O_3$, AlN, SiC, BeO or $Si_3N_4$. For instance, the substrate may, e.g., be a Direct Copper Bonding (DCB) substrate, a Direct Aluminum Bonding (DAB) substrate, or an Active Metal Brazing (AMB) substrate. Further, the substrate may be an Insulated Metal Substrate (IMS). An Insulated Metal Substrate generally comprises a dielectric insulation layer comprising (filled) materials such as epoxy resin or polyimide, for example. The material of the dielectric insulation layer may be filled with ceramic particles, for example. Such particles may comprise, e.g., $Si_2O$, $Al_2O_3$, AlN, or BN and may have a diameter of between about 1 μm and about 50 μm. The substrate may also be a conventional printed circuit board (PCB) having a non-ceramic dielectric insulation layer. For instance, a non-ceramic dielectric insulation layer may consist of or include a cured resin.

One or more semiconductor substrates may be mounted on a single base plate. One or more semiconductor bodies may be arranged on each of the at least one semiconductor substrate. Each of the semiconductor bodies arranged on the at least one semiconductor substrate may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable semiconductor element. The one or more semiconductor bodies may form a semiconductor arrangement on the semiconductor substrate.

Before arranging at least one semiconductor substrate in a housing during an assembly process, the semiconductor substrates need to be produced and to be transported to an assembly line. Usually, the semiconductor substrates are produced at a separate production plant and need to be shipped to the assembly line. Unfinished bare semiconductor substrates may also be transported or shipped for further treatment (e.g., for structuring of the metallization layers). Further, fitted semiconductor substrates with one or more elements (e.g., semiconductor bodies) mounted thereon may be transported or shipped for further handling or assembly. To transport the finished or unfinished unequipped (unassembled) or fitted (at least partly assembled) semiconductor substrates to another assembly line or to a customer, usually a plurality of semiconductor substrates is packed into a tray.

The tray with the semiconductor substrates stacked therein is then inserted into a transportation bag and, subsequently, air is evacuated from the transportation bag and it is prepared for shipping. However, although the tray and the transportation bag prevent the semiconductor substrates from shifting inside the tray to a certain degree, there is a risk that different semiconductor substrates may grate against each other or against the tray, which may result in abrasion of semiconductor substrate material. Even further, there is a risk that small parts of the semiconductor substrates may break off or that the semiconductor substrates break. A transportation system should generally allow for an easy handling (semiconductor substrates may be inserted easily into the tray), while at the same time the transportation system should securely retain the semiconductor substrates during transportation/shipping.

Now referring to FIGS. 1A to 1E, a transportation system and a method for preparing finished or unfinished bare, unequipped (unassembled) or at least partly fitted (assembled) semiconductor substrates 12 for transportation is described. Semiconductor substrates 12 may be easily inserted into the transportation system 10. Further, the transportation system securely retains the semiconductor substrates 12 during transport/shipping.

As is schematically illustrated in FIG. 1A, the transportation system 10 comprises a tray 16. The tray 16 comprises a bottom and circumferential sidewalls. The bottom and the sidewalls form a case that is configured to receive a plurality of semiconductor substrates 12. The tray 16 may have a rectangular cross-section, for example. The tray 16 is open at a top side. That is, the tray 16 comprises an opening at its top side. The plurality of semiconductor substrates 12 may be inserted into the tray 16 through this opening. The plurality of semiconductor substrates 12 may form a stack inside the tray 16, wherein the semiconductor substrates 12 are stacked onto each other in parallel to the bottom of the tray 16 as is schematically illustrated in FIGS. 1A to 1E. That is, a top surface of the semiconductor substrates 12 extends in parallel to the bottom of the tray 16. A top surface of a semiconductor substrate 12 is a surface on which elements such as, e.g., semiconductor bodies are or may be mounted.

Figure 1B:
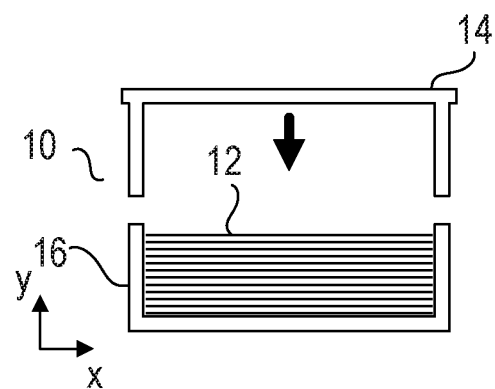
Figure 1C:
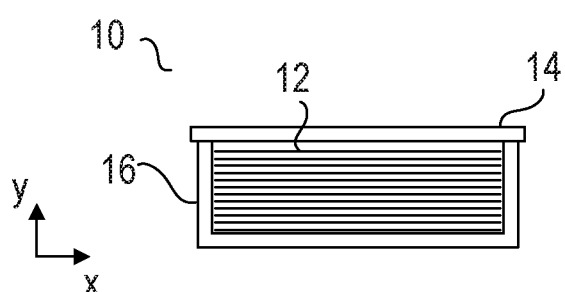

As is schematically illustrated in FIG. 1B, after inserting the plurality of semiconductor substrates 12 into the tray 16, a lid 14 may be arranged on the tray 16. The lid 14, when in its final position, at least partially closes the opening of the tray 16. In FIG. 1B, the lid 14 is illustrated before mounting it on the tray 16, while FIG. 1C illustrates the lid 14 after mounting it on the tray 16. At this point in FIG. 1C, the plurality of substrates 12 are not yet secured for transportation. That is, no significant force is exerted on the semiconductor substrates 12 and the semiconductor substrates rest loosely inside the tray 16. The semiconductor substrates 12, for example, may rest on projections or support surfaces of the tray 16. For example, projections or support surfaces may be attached to the sidewalls of the tray 16 to allow a stacking of the semiconductor substrates 12. However, at this point the semiconductor substrates 12 are not clamped or retained in any way. That is, the semiconductor substrates 12 may still shift inside the tray 16 to a certain degree.

Figure 1D:
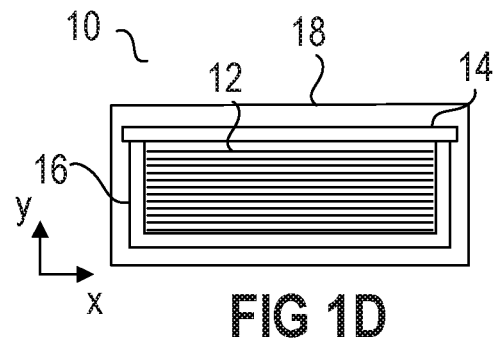
Figure 1E:
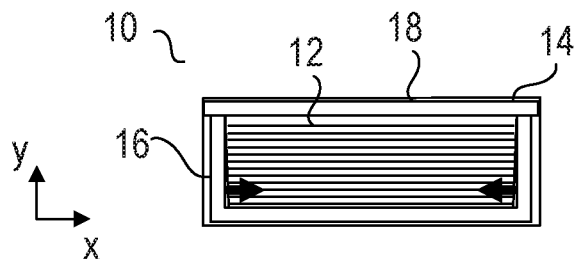

Now referring to FIG. 1D, the transportation system 10 further comprises a packaging or transportation bag 18. The tray 16 and the lid 14 that is arranged thereon are inserted into the packaging bag 18. The packaging bag 18 may be a tube or bag like cover that is large enough to receive the tray 16 with the lid 14 arranged thereon inside. The packaging bag 18 may comprise or may consist of a plastic material, for example. According to one example, the packaging bag 18 is formed by a plastic sheet or plastic foil. Optionally, the packaging bag 18 may comprise a coating layer such as a metallic layer, for example. The packaging bag 18 is closed and the air is evacuated. Subsequently, the packaging bag 18 is sealed. This is schematically illustrated in FIG. 1E. After evacuating the packaging bag 18, thereby removing the air inside the packaging bag 18, the material of the packaging bag 18 clings to (is pressed onto) the outside of the tray 16 and the lid 14.

The lid 14 is at least partially flexible. When evacuating the air from the packaging bag 18, at least some parts of the lid 14 are forced to move towards the semiconductor substrates 12, thereby exerting pressure on the plurality of semiconductor substrates 12. This is illustrated by bold arrows in FIG. 1E. In this way, the plurality of semiconductor substrates 12 are clamped by the lid 14 from at least two sides. In this way, the semiconductor substrates 12 may be held in place during transportation/shipping until the vacuum sealed packaging bag 18 is opened, which eliminates the vacuum inside the packaging bag 18. When the packaging bag 18 is opened and air is allowed to fill the packaging bag 18, the lid 14 of the transportation system 10 may release the semiconductor substrates 12. That is, a pressure exerted on the semiconductor substrates 12 may be reduced such that the lid 14 may be easily removed from the tray 16 without damaging the semiconductor substrates 12.

The semiconductor substrates 12, however, are only held clamped by the lid 14 when the air has been evacuated from the packaging bag 18. The tray 16 does not exert significant forces on the semiconductor substrates 12. The sidewalls of the tray 16 may be formed of a stiff or rigid material or may have a certain minimum thickness. When air is evacuated from the packaging bag 18, the sidewalls of the tray 16 do not move towards the semiconductor substrates 12 at all, or they move towards the semiconductor substrates 12 only marginally and the movement is not sufficient to perform any clamping on the semiconductor substrates 12.

Now referring to FIG. 2, an exemplary lid 14 is illustrated. In the example of FIG. 2, the lid 14 comprises a cover plate 24 and a plurality of arms 26. The arms 26 extend from the cover plate 24. In the example illustrated in FIG. 2, the cover plate 24 has a rectangular form. Each of the arms 26 is arranged on a different one of the four sides of the cover plate 24. In particular, two of the arms 26 are arranged opposite each other on the longitudinal sides of the cover plate 24, and two of the arms 26 are arranged opposite each other on the narrow sides of the cover plate 24. In this way, two opposite arms exert a force on the plurality of semiconductor substrates 12 in opposite directions, thereby clamping the semiconductor substrates between the respective ones of the arms 26.

In the example illustrated in FIG. 2, the lid 14 comprises four arms 26. In this way, the semiconductor substrates 12 are clamped from four different sides, thereby preventing a movement of the semiconductor substrates 12 in all horizontal directions. This, however, is only an example. It is also possible, that the lid 14 only comprises two arms 26. The two arms 26 may be arranged opposite to each other. By clamping the semiconductor substrates 12 from two opposite sides, a movement in all horizontal directions can be prevented as well. According to another example, one arm 26 is arranged on one of the longitudinal sides, and another arm 26 is arranged on one of the narrow sides of the cover plate 24. The force exerted by the arms 26 may press the semiconductor substrates 12 towards the sidewalls of the tray 16 opposite to the respective arms. That is, the semiconductor substrates 12 may be clamped between the respective arms 26 and the respective opposite sidewall of the tray 16. In this way, a movement of the semiconductor substrates 12 during transportation/shipping can be prevented as well. That is, generally speaking, the lid 14 may comprise at least two arms 26. However, the more arms 26 the lid comprises 14, the more securely the semiconductor substrates 12 can be held inside the tray 16.

However, when pressing the semiconductor substrates 12 to a sidewall of the tray 16, no force is actively exerted by the sidewalls. The force is only actively exerted by the plurality of arms 26.

When arranging the lid 14 on the tray 16, the arms 26 are inserted into the tray 16 between the sidewalls of the tray 16 and the semiconductor substrates 12 that are arranged inside the tray 16. Therefore, at least in those places where the arms 26 are inserted into the tray 16, a distance between the semiconductor substrates 12 and the respective sidewall may be large enough in order to allow for the arms 26 to be inserted between the respective sidewalls and the semiconductor substrates 12.

Now referring to FIG. 3, a top view of an exemplary tray 16 is schematically illustrated. As can be seen, the sidewalls in this example comprise a plurality of bulges 22. That is, generally the sidewalls are arranged close to the semiconductor substrates 12 arranged inside the tray 16. For example, a distance between the semiconductor substrates 12 and the sidewalls may be between 0.5 and 1.5 mm. Depending on the material and the thickness of the sidewalls, the distance may be chosen smaller or larger than these exemplary distances. If the sidewalls move towards the semiconductor substrates 12 to a certain degree when air is evacuated from the packaging bag 18, a distance may be chosen to be larger in order to prevent the sidewalls from exerting a force on the semiconductor substrates 12. If the sidewalls do not significantly move towards the semiconductor substrates 12 when air is evacuated from the packaging bag 18, a distance may be chosen to be smaller. The number of bulges 22 may correspond to the number of arms 26, for example. That is, each arm 26 may be inserted into one of the bulges 22 between the semiconductor substrates 12 and the sidewalls.

Generating a vacuum inside the packaging bag 18 alone may not be sufficient to force the arms 26 to move towards the semiconductor substrates. Especially if the sidewalls of the tray 16 are arranged between the arms 26 and the packaging bag 18, the packaging bag 18 may not exert any force on the arms 26. Therefore, the packaging bag 18 may not exert any force directly on the arms 26 of the lid 14. The arms 26, therefore, may be forced to perform a movement towards the semiconductor substrates 12 by means of a suitable arrangement. One example of such an arrangement is schematically illustrated in FIGS. 4A to 4C. As can be seen in the cross-sectional view of FIG. 4A, each arm 26 may be chamfered towards a lower end of the arm 26 that is distant to the cover plate 24. The tray 16, on the other hand, may comprise a plurality of inclined surfaces. Each inclined surface slopes from a sidewall of the tray 16 towards the bottom of the tray 16 and forms a counterpart for the lower end of the respective arm 26.

When inserting the arms 26 into the tray 16, a gap may remain between the cover plate 24 and the sidewalls of the tray 16. That is because the lower ends of the arms 26 may rest on an upper part of the inclined surfaces (see, e.g., FIG. 4B). That is, the arms 26 in this state do not exert any force on the semiconductor substrates 12. When air is evacuated from the packaging bag 18, the cover plate 24 of the lid 14 is pressed towards the tray 16 (indicated in bold arrows in FIGS. 4A and 4B) by the packaging bag 18. When the lid 14 is pressed towards the tray 16, however, the lower ends of the arms slide along the inclined surfaces towards the semiconductor substrates 12 (illustrated in bold arrows in FIG. 4B). That is, the arms 26 may be flexible to a certain degree to allow this movement. When the packaging bag 18 is fully evacuated and sealed, the lid 14 is in its final position with the arms 26 pressed against the semiconductor substrates 12, thereby exerting pressure on the semiconductor substrates 12 and preventing them from shifting inside the tray 16 (see FIG. 4C).

Figure 5A:
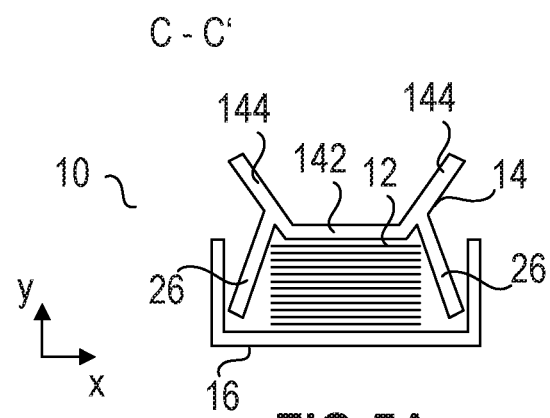
FIGS. 5A and 5B schematically illustrate cross sectional views of an exemplary transportation system during and after mounting.
Figure 5B:
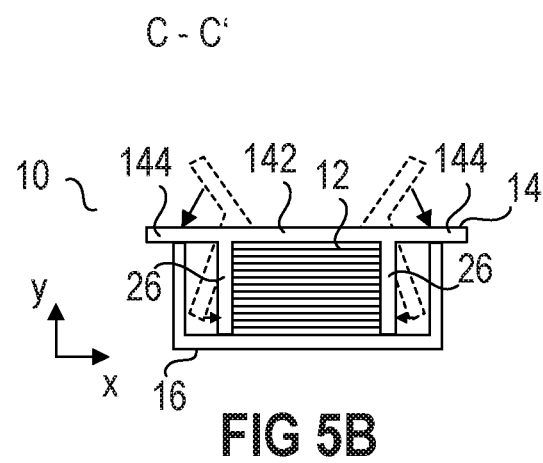

The transportation system 10 illustrated in FIGS. 4A to 4C, however, is only one example. Another exemplary transportation system 10 is illustrated in FIGS. 5A and 5B. In this example, the cover plate 24 of the lid 14 comprises a central portion 142 and a plurality of outer portions 144. The central portion 142, when the lid 14 is arranged on the tray 16, is arranged in parallel to the plurality of semiconductor substrates 12 stacked inside the tray 16. Each of the plurality of outer portions 144 is coupled to one side of the central portion 142. That is, for example, if the central portion 142 has a rectangular form, one outer portion 144 may be coupled to each of the longitudinal sides of the central portion 142, respectively, and one outer portion 144 may be coupled to each of the narrow sides of the central portion 142, respectively. The connection areas between the central portion 142 and the plurality of outer portions 144 form a plurality of rotation axes. In the cross-sectional view illustrated in FIG. 5A, which illustrates an initial form of the lid 14, the outer portions 144 are not arranged on the same plane as the central portion 142. An angle α formed between the central portion 142 and each of the outer portions 144 may be between 135° and 180°, for example. In FIG. 5A this angle α is illustrated as being nearly 135° for illustration purposes only. According to one example, the angle α is between 170° and 180°, or even between 175° and 180°. When air is evacuated from the packaging bag 18 (not specifically illustrated in FIGS. 5A and 5B), the outer portions 144 are forced by the packaging bag 18 into a tight fit around the tray 16 and the lid 14 performs a rotary movement around the respective rotation axis, thereby moving towards the sidewalls of the tray 16. This is schematically illustrated in FIG. 5B. The movement of the outer portions 144 is indicated in bold arrows in FIG. 5B. The outer portions 144 in their final position may be pressed onto the sidewalls of the tray 16 from a vertical direction, thereby exerting a force on an upper end of the sidewalls.

In the example illustrated in FIGS. 5A and 5B, each of the plurality of arms 26 is coupled to one of the outer portions 144 of the lid 14. When the outer portions 144 are forced to move towards the tray 16, at the same time the arms 26 move together with the outer portions 144 and are thereby forced to move towards the semiconductor substrates 12, thereby exerting pressure on the plurality of semiconductor substrates 12 (illustrated with arrows in FIG. 5B).

Figure 6A:
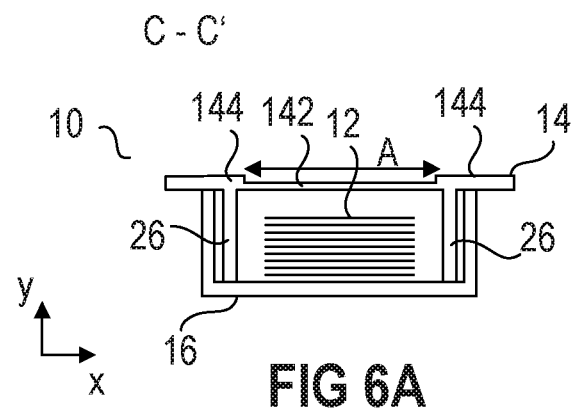
FIGS. 6A and 6B schematically illustrate cross sectional views of an exemplary transportation system during and after mounting.
Figure 6B:
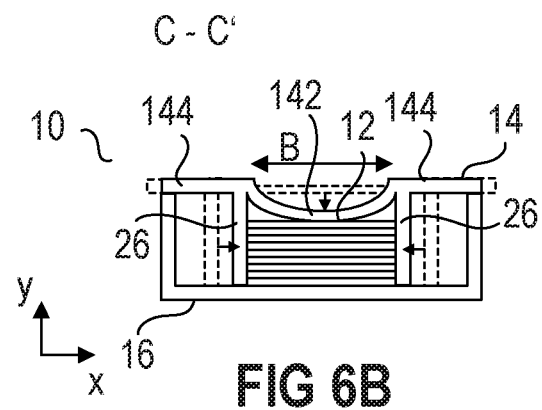

An even further example is illustrated in FIGS. 6A and 6B. In the example illustrated in FIGS. 6A and 6B, at least a central part 142 of the lid 14 is dented towards the stack of semiconductor substrates 12 arranged inside the tray 16 when a vacuum is generated inside the packaging bag 18. This is schematically illustrated in the cross-sectional view in FIG. 6B. FIG. 6A illustrates the arrangement in an initial state before generating the vacuum. The central part 142 of the lid 14 in this way exerts a force on the semiconductor substrates 12 from above (vertical direction y). An effective dimension of the central part 142 in a horizontal direction x may decrease when the central part 142 dents towards the semiconductor substrates 12. For example, in an initial state, the central portion 142 may have a length A in the horizontal direction x, and in a final position, the central portion 142 may have a length B in the same horizontal direction x, wherein B<A.

The lid 14 may further comprise outer portions 144. The outer portions 144 may be arranged in the same horizontal plane as the central portion 142. In a vertical direction y that is perpendicular to the horizontal direction x, the central portion 142 may have a thickness that is less than a thickness of the outer portions 144 in the same direction y. In this way, only the thinner central portion 142 dents towards the semiconductor substrates 12, while the thicker outer portions 144 may have a thickness that prevents the outer portions 144 from denting. The pressure that is generated by evacuating the air from the packaging bag 18 may be sufficient, however, to dent the central portion 142. The arms 26 may be coupled to the outer portions 144. When the central portion 142 dents towards the semiconductor substrates 12 and the length of the central portion 142 is reduced (A→B), a distance between two opposite outer portions 144 is also reduced. This forces the arms 26 that are coupled to the outer portions 144 to move towards the semiconductor substrates 12, thereby exerting pressure on the plurality of semiconductor substrates 12 and clamping the semiconductor substrates 12, thereby preventing the semiconductor substrates from shifting inside the tray 16. The movements performed by the central portion 142 of the lid 14, the outer portions 144 of the lid 14, and the arms 26 are indicated by arrows in the cross-sectional view illustrated in FIG. 6B. FIG. 6A exemplarily illustrates an initial position of the central part 142, the outer parts 144, and the arms 26.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transportation system for semiconductor substrates, comprising:
    a tray comprising a bottom and circumferential sidewalls, the tray having an opening on a top side and configured to receive a plurality of semiconductor substrates through the opening such that the semiconductor substrates are stacked onto each other in the tray in parallel to the bottom of the tray;
    a lid comprising a cover plate and at least two arms extending from the cover plate, the at least two arms being configured to be inserted into the tray between the sidewalls of the tray and the plurality of semiconductor substrates, the cover plate being configured to cover the opening of the tray when the lid is fully mounted to the tray; and
    a packaging bag configured to enclose the tray with the plurality of semiconductor substrates stacked therein and the lid arranged thereon, wherein the packaging bag is configured to be evacuated of air and sealed such that the tray and the lid arranged in the packaging bag are vacuum sealed inside the packaging bag, wherein when a vacuum is generated inside the packaging bag, the lid is pressed onto the tray and the arms of the lid move towards the plurality of semiconductor substrates such that pressure is exerted on the plurality of semiconductor substrates from at least two sides and the plurality of semiconductor substrates are held in place.

2. The transportation system of claim 1, wherein when the vacuum is generated inside the packaging bag, the sidewalls of the tray do not exert a pressure on the plurality of semiconductor substrates.

3. The transportation system of claim 1, wherein the sidewalls of the tray comprise a plurality of bulges, and wherein each of the at least two arms of the lid is inserted into a different one of the plurality of bulges.

4. The transportation system of claim 1, wherein each of the arms of the lid is chamfered towards a lower end distant from the cover plate.

5. The transportation system of claim 4, wherein:
the tray comprises a plurality of inclined surfaces, each inclined surface sloping from a sidewall of the tray towards the bottom of the tray; and
when the lid is pressed onto the tray, each arm is pressed onto one of the inclined surfaces with its lower end, causing the lower end of each arm to slide along the inclined surface such that the arm is forced to move towards the plurality of semiconductor substrates and pressure is exerted on the plurality of semiconductor substrates.

6. The transportation system of claim 1, wherein when the vacuum is generated inside the packaging bag, at least a central portion of the lid is dented toward the stacked semiconductor substrates inside the tray such that a force is exerted on the stack of semiconductor substrates from above.

7. The transportation system of claim 6, wherein when at least the central portion of the lid is dented toward the stacked semiconductor substrates inside the tray, the plurality of arms are forced to move towards the plurality of semiconductor substrates such that pressure is exerted on the plurality of semiconductor substrates.

8. The transportation system of claim 6, wherein:
the lid further comprises outer portions arranged in a same horizontal plane as the central portion; and
in a vertical direction that is perpendicular to the horizontal plane, the central portion has a thickness that is less than a thickness of the outer portions in the same direction.

9. The transportation system of claim 1, wherein:
the lid comprises a central portion arranged above and parallel to the plurality of semiconductor substrates, and a plurality of outer portions, each outer portion being coupled to one side of the central portion, the connection areas between the central portion and the plurality of outer portions forming a plurality of rotation axes; and
when evacuating the air from the packaging bag, each of the plurality of outer portions is forced to perform a rotary motion along the respective rotation axis, thereby moving towards a sidewall of the tray and exerting a force onto the respective sidewall.

10. The transportation system of claim 9, wherein:
each of the plurality of arms is coupled to one of the outer portions; and
when the air is evacuated from the packaging bag and the outer portions perform a rotary motion, the arms are forced to move towards the plurality of semiconductor substrates such that pressure is exerted on the plurality of semiconductor substrates.

11. The transportation system of claim 9, wherein before the air is evacuated from the packaging bag, an angle is formed between the central portion and each of the outer portions, and wherein the angle is between 170° and 180° or between 175° and 180°.

12. The transportation system of claim 1, wherein the packaging bag is a tube or bag like cover.

13. The transportation system of claim 1, wherein the packaging bag comprises a plastic sheet or plastic foil.

14. A method, comprising:
stacking a plurality of semiconductor substrates inside a tray, the tray comprising a bottom and circumferential sidewalls, the tray having an opening on a top side and configured to receive the plurality of semiconductor substrates through the opening, the plurality of semiconductor substrates being stacked onto each other in the tray in parallel to the bottom of the tray;
arranging a lid on the tray, the lid comprising a cover plate and at least two arms extending from the cover plate, the at least two arms being inserted into the tray between the sidewalls of the tray and the plurality of semiconductor substrates, the cover plate covering the opening of the tray when the lid is fully mounted on the tray;
arranging the tray with the lid arranged thereon in a packaging bag such that the packaging bag encloses the tray with the plurality of semiconductor substrates stacked therein and the lid arranged thereon; and
evacuating and sealing the packaging bag such that the tray and the lid arranged in the packaging bag are vacuum sealed inside the packaging bag,
wherein when a vacuum is generated inside the packaging bag, the lid is pressed onto the tray and the arms of the lid move towards the plurality of semiconductor substrates such that pressure is exerted on the plurality of semiconductor substrates from at least two sides and the plurality of semiconductor substrates are held in place.

* * * * *